United States Patent
Zhao et al.

(10) Patent No.: US 9,666,415 B2
(45) Date of Patent: May 30, 2017

(54) HEATED AIR PLASMA TREATMENT

(71) Applicant: Ford Global Technologies, LLC, Dearborn, MI (US)

(72) Inventors: Haibo Zhao, Northville, MI (US); Patrick James Blanchard, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 130 days.

(21) Appl. No.: 14/619,537

(22) Filed: Feb. 11, 2015

(65) Prior Publication Data

US 2016/0233061 A1   Aug. 11, 2016

(51) Int. Cl.
*H01J 37/32* (2006.01)

(52) U.S. Cl.
CPC .. *H01J 37/32366* (2013.01); *H01J 37/32825* (2013.01); *H05H 2240/10* (2013.01)

(58) Field of Classification Search
None
See application file for complete search history.

(56) References Cited

U.S. PATENT DOCUMENTS

| | | | | |
|---|---|---|---|---|
| 5,206,471 A * | 4/1993 | Smith | | C23C 16/452 118/620 |
| 5,256,205 A * | 10/1993 | Schmitt, III | | C23C 16/452 118/718 |
| 5,400,665 A * | 3/1995 | Zhu | | B23K 9/328 250/288 |
| 5,895,558 A * | 4/1999 | Spence | | H01J 37/32 204/164 |
| 6,395,095 B1 * | 5/2002 | Jones | | H01J 37/321 118/728 |
| 6,406,759 B1 * | 6/2002 | Roth | | A61L 2/14 134/1.1 |
| 6,441,553 B1 * | 8/2002 | Yializis | | H01J 37/32009 118/50.1 |

(Continued)

OTHER PUBLICATIONS

Kavka et al., "Experimental study of effect of gas nature on plasma arc cutting of mild steel," Journal of Physics D—Applied Physics, vol. 46, Issue 22 Published 2013, 4 pgs.

(Continued)

*Primary Examiner* — Douglas W Owens
*Assistant Examiner* — Srinivas Sathiraju
(74) *Attorney, Agent, or Firm* — Damian Porcari; Brooks Kushman P.C.

(57) ABSTRACT

The present disclosure includes atmospheric plasma systems and methods for plasma treating a surface. The plasma system may include a plasma probe configured to receive a source air that is at or above atmospheric pressure and discharge a plasma from a probe tip. It may also include an air supply system including an air supply conduit configured to supply the source air to the plasma probe and a heat source configured to increase a temperature of the source air in the air supply system to above an ambient temperature. The heat source may include an inline heater disposed within the air supply conduit. The source air may be heated to a temperature of 25° C. to 1,000° C. The heated air plasma system may provide a higher plasma dosage to a treated surface and may allow for reduced cycle times and larger plasma treatment working windows.

20 Claims, 4 Drawing Sheets

(56) References Cited

U.S. PATENT DOCUMENTS

| | | | | |
|---|---|---|---|---|
| 6,676,802 | B2* | 1/2004 | Roth | A61L 2/14 118/715 |
| 7,067,405 | B2* | 6/2006 | Mikhael | B05D 1/62 438/503 |
| 7,531,061 | B2* | 5/2009 | Long | H01J 37/3244 118/666 |
| 8,001,927 | B2* | 8/2011 | Dorier | H05H 1/34 118/723 R |
| 8,398,771 | B2* | 3/2013 | Nakada | C23C 16/4401 118/724 |
| 8,580,076 | B2* | 11/2013 | Becknell | H01J 37/32357 118/715 |
| 8,866,389 | B2* | 10/2014 | Okino | H05H 1/0006 118/726 |
| 8,928,230 | B2* | 1/2015 | Watson | A61M 16/12 315/111.21 |
| 8,975,817 | B2* | 3/2015 | Kellogg | H01J 37/32449 315/111.21 |
| 8,994,270 | B2* | 3/2015 | Koo | H01J 37/32366 315/111.11 |
| 9,117,636 | B2* | 8/2015 | Koo | H01J 37/32348 |
| 9,288,886 | B2* | 3/2016 | Koo | A61B 18/042 |
| 9,406,485 | B1* | 8/2016 | Cheng | H01J 37/32183 |
| 9,491,841 | B2* | 11/2016 | Jevtic | H05H 1/46 |
| 2002/0127853 | A1* | 9/2002 | Hubacek | H01J 37/32009 438/689 |
| 2002/0168466 | A1* | 11/2002 | Tapphorn | B05B 7/144 427/180 |
| 2002/0195950 | A1* | 12/2002 | Mikhael | C23C 16/30 315/111.21 |
| 2005/0001527 | A1* | 1/2005 | Sugiyama | C23C 16/505 313/231.31 |
| 2006/0278254 | A1* | 12/2006 | Jackson | B08B 7/0021 134/21 |
| 2006/0279222 | A1* | 12/2006 | Jackson | B08B 7/0021 315/111.21 |
| 2008/0217324 | A1* | 9/2008 | Abbott | C23C 4/06 219/538 |
| 2009/0087584 | A1* | 4/2009 | Taguchi | C23C 4/134 427/569 |
| 2010/0094430 | A1* | 4/2010 | Krumdieck | A61F 2/30767 623/23.5 |
| 2010/0209618 | A1 | 8/2010 | Kuhlenschmidt et al. | |
| 2010/0224129 | A1* | 9/2010 | Malecki | B01J 21/185 118/723 R |
| 2011/0048025 | A1 | 3/2011 | Ginn et al. | |
| 2011/0108726 | A1* | 5/2011 | Hiraoka | H01J 49/165 250/282 |
| 2012/0296265 | A1 | 11/2012 | Dobrynin et al. | |
| 2013/0108803 | A1 | 5/2013 | Matos et al. | |
| 2014/0023856 | A1* | 1/2014 | Bisges | C23C 4/12 428/329 |
| 2014/0180276 | A1 | 6/2014 | Kuo | |
| 2014/0200506 | A1* | 7/2014 | Zemel | A61B 18/042 604/23 |
| 2014/0262789 | A1* | 9/2014 | Shannon | C02F 1/46 204/554 |
| 2014/0319382 | A1* | 10/2014 | Hancock | A61L 2/14 250/492.1 |

OTHER PUBLICATIONS

Clo, J. Harry, "The Effect of Temperature on the Ionization of a Gas," Astrophysical Journal, vol. 33, p. 115, Published 1911, 10 pgs.

* cited by examiner

|  | ROOM TEMPERATURE PLASMA | HOT AIR PLASMA |
| --- | --- | --- |
| WATER WET OUT | NO | YES |
| DYNE LEVEL | 48 | 72 |
| SURFACE ENERGY LEVEL OF TREATED PARTS | LOW TO MEDIUM | HIGH |

HEATED AIR PLASMA TREATMENT

TECHNICAL FIELD

The present disclosure relates to air plasma treatments using heated air, for example, to increase plasma dosage.

BACKGROUND

Plasma is a state of matter that includes a plurality of charged particles, sometimes referred to as an ionized gas cloud since the particles in plasma are electrically charged. Air or atmospheric plasma is a plasma in which the pressure approximately matches that of the surrounding atmosphere, rather than low or vacuum-level pressures. Accordingly, the equipment and cost necessary to implement air plasma treatments is relatively low, and plasma treatments may be used directly in production lines. Air or atmospheric plasma may be used to modify the surface energy of a treated component, and therefore may be used to improve bonding between two components. However, air plasma treatment faces several challenges, including high tool costs, long cycle times, and a relatively small treatment working window.

SUMMARY

In at least one embodiment, an atmospheric plasma system is provided. The system may include a plasma probe configured to receive a source air that is at or above atmospheric pressure and discharge a plasma from a probe tip, an air supply system including an air supply conduit configured to supply the source air to the plasma probe, and a heat source configured to increase a temperature of the source air in the air supply system to above an ambient temperature.

In one embodiment, the heat source includes an inline heater. The inline heater may form at least a portion of the air supply conduit. In one embodiment, the heat source at least partially surrounds a portion of the air supply conduit. The heat source may include at least one of a resistance coil, an induction heater, and a heated fluid circulation system. In another embodiment, the air supply system includes an air tank connected to the air supply conduit and the heat source is configured to heat air in the air tank. The heat source may be configured to heat the source air to a temperature of 25° C. to 1,000° C.

In at least one embodiment, a method of plasma treating a surface is provided. The method may include heating a source air within an air supply system including an air supply conduit to a temperature above the ambient temperature, providing the heated source air to a plasma probe via an the air supply conduit, generating an atmospheric plasma in the plasma probe, and discharging a plasma from a tip of the plasma probe onto the surface.

In one embodiment, the heating step includes heating the source air with an inline heater disposed within the air supply conduit. In another embodiment, the heating step includes heating the source air with a heat source that at least partially surrounds a portion of the air supply conduit. The air supply system may include an air tank and the heating step may include heating air in the tank. The discharging step may include moving the plasma probe tip at a speed of at least 75 mm/s relative to the surface and/or maintaining a distance from the tip of the plasma probe to the surface of at least 10 mm. The heating step may include heating the source air to a temperature of 25° C. to 1,000° C. In another embodiment, the heating step may include heating the source air to a temperature of at least 100° C.

In at least one embodiment, an atmospheric plasma treatment system is provided. The system may include a plasma probe configured to receive a source air that is at or above atmospheric pressure and discharge a plasma from a probe tip, an air supply conduit configured to supply the source air to the plasma probe, a heat source configured to increase a temperature of the source air in the air supply conduit, and a fixture configured to receive a component to be plasma treated.

In one embodiment, the heat source includes an inline heater. The heat source may be configured to heat the source air to a temperature of 25° C. to 1,000° C. In one embodiment, the plasma probe is configured to move the plasma probe tip at a speed of at least 75 mm/s relative to a component-receiving surface of the fixture. In another embodiment, the plasma probe is configured to discharge the plasma with a distance of at least 10 mm from the tip of the plasma probe to a surface of the component received by the fixture.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Air or atmospheric plasma treatments may be used to modify the surface energy of a treated component. For example, the plasma treatment may increase the surface energy of a treated component, making it more reactive and causing it to bond more strongly to other components or materials. There are numerous control parameters involved in air plasma treatments that control the dosage of plasma received by the treated component. Two parameters that have a significant impact on the received plasma dosage are the speed at which the plasma probe or jet is moved across the surface of the component and the distance of the tip of the plasma probe from the surface of the component. Slower probe speeds generally increase the plasma dosage received by the component, while faster speed generally decrease the dosage. A smaller probe distance (e.g., from the probe tip to the component surface) generally increases the plasma dosage received by the component, while a greater distance generally decreases the dosage. These two parameters may, in turn, affect several additional process parameters: cycle time and treatment working window.

The cycle time is related to the speed of the plasma treatment and is the time it takes to plasma treat a component or a group or batch of components. In order for the treated component to receive a predetermined minimum plasma dosage level at a given probe distance, a certain minimum probe speed (e.g., linear speed) must be used. Accordingly, for a given minimum dosage level and probe distance, the speed of the probe is a limiting factor for the cycle time. Conventional air plasma systems currently must use a relatively slow probe speed in order to deliver a sufficient plasma dosage. For example, the probe speed in current air plasma systems may be about 50 mm/s. In high-volume industries, cycle time may be an important parameter and may impact the ability to effectively or efficiently implement the plasma treatment in the production line. At current speeds (e.g., about 50 mm/s), the cycle time may be too long for a single system to meet the volume requirements. Therefore, multiple air plasma systems may be required, which represents a significant equipment cost and space footprint in production facilities. Accordingly, an improvement to the air plasma treatment process that increases probe speed and reduces cycle time would increase production rates and reduce costs.

Another parameter that may affect the speed and/or quality of the plasma treatment process is the plasma treatment working window, which is the distance from the tip of the plasma probe to the parts/components being treated. Similar to the probe speed, the working window may be a limiting factor in the plasma treatment process. The plasma generated by the air plasma probe may have a plume or torch-like shape. As a result, the intensity or the dosage that is received by the treated component may decrease with increased distance from the probe tip. Therefore, similar to the minimum probe speed, there may be a maximum probe tip distance cannot be exceeded in order to deliver a predetermined dosage at a given probe speed. In addition, due to the very high temperature of the plasma that exits the plasma probe, there may be a minimum distance from the component surface to the probe tip. If the plasma probe is too close to the component surface, the high temperature plasma may burn, melt, or otherwise damage the component. Another potential complication if the plasma probe is too close to the component is that the probe may actually contact or collide with the component if the component is slightly misaligned or the system tolerances are too loose. Therefore, the plasma treatment process may have a minimum and maximum probe tip distance, which may be referred to as the plasma treatment working window.

In conventional air plasma systems currently being used, the plasma treatment working window is relatively small. For example, an air plasma system using a typical probe speed (e.g., about 50 mm/s), may require that the probe tip distance is about 6 mm, plus or minus 1-2 mm. While a 6 mm probe tip distance is workable, it may require very little deviation in the plasma treatment process. For example, components to be plasma treated may be held in a fixture during the treatment. Generally, a person or a robot picks up and places the component in the fixture, which inherently has some level of deviation. Deviations in the component location relative to the probe tip may therefore move the probe tip out of the working window distance range. In one example, it has been found that the deviation in probe distance for a robot-loaded fixture may be up to about 2 mm. A 2 mm deviation in the probe distance may be significant enough to move the component outside of the working window: either too close (which may cause burning/melting) or too far away (insufficient plasma dosage). Accordingly, an improvement to the air plasma treatment process that increases the maximum probe tip distance and widens the plasma treatment working window would make the plasma treatment process more robust.

It has been discovered that an air plasma process having a higher ion density (e.g., stronger plasma flume) may improve cycle time and the plasma treatment working window. In at least one embodiment, an air plasma treatment process is disclosed in which the source air for the air plasma treatment process is heated prior to entering the plasma probe. Without being held to any particular theory, it is believed that based on chemistry and thermodynamics, when air is heated, the electrons orbiting around nuclei gain energy from the heat and have a higher probability of escaping from their confined travel orbits. Once the electrons hop and escape from the nuclei, the air atoms are not neutralized anymore. Accordingly, there is a higher chance of air ionization occurring in the electric field, which may generate a stronger plasma flume.

With reference to FIGS. 1-4, schematic diagrams of an air or atmospheric (e.g., ambient pressure) plasma system 10 is shown. The system 10 includes a plasma probe 12 having a probe tip 14. The plasma system 10 may be any suitable air plasma system, such as an AC (alternating current) excitation (e.g., corona discharge), DC (direct current) excitation (e.g., electric arc), radio wave excitation, or microwave excitation system. The fundamentals of air plasma systems are known in the art and will not be explained in detail. In general, a plasma is generated by heating a gas or subjecting it to a strong electromagnetic field. For example, in a DC plasma system, a pulsed electric arc is generated by a high-voltage discharge (e.g., 5-15 kV, 10-100 kHz). A source gas, which may be compressed air, flows past the pulsed electric arc and is excited and converted to the plasma state. The plasma is then directed onto the surface of the component 36 being treated by the probe tip.

The air plasma system 10 includes an air supply system, including an air supply 16, which may supply the source gas to the plasma probe 12. The air supply 16 may be a hose, pipe, tube, or other type of conduit. The source gas may be ambient air or it may be a controlled composition, such as nitrogen, oxygen, argon, fluorine, or mixtures thereof. The source gas may be pressurized in order to facilitate the plasma jet from the probe tip 14. For example, the source gas may come from a source of compressed air or may be moved by a fan or duct system, which may be part of the air supply system. In conventional air plasma systems, the source gas is provided to the plasma probe 12 at ambient temperature, such as about 20° C. (e.g., room temperature). In the present disclosure, however, an air plasma system 10 is provided in which the source gas is heated to above the ambient temperature in order to produce a stronger plasma flume.

Figure 1:
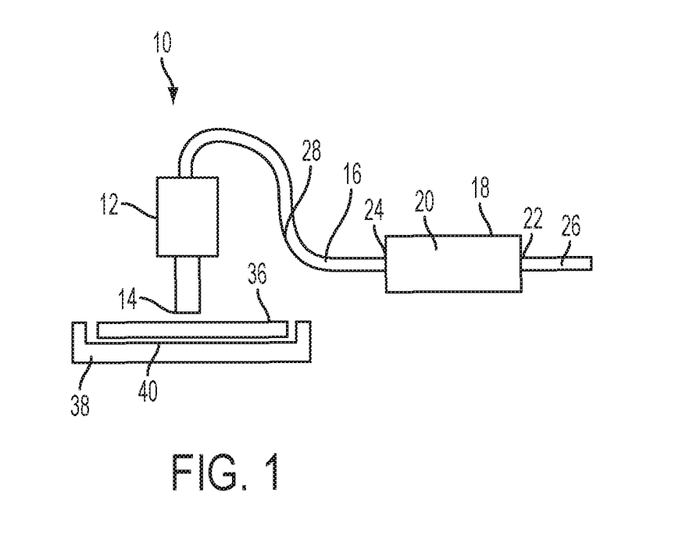
FIG. 1 is a schematic view of an atmospheric plasma system including an inline heater, according to an embodiment.

With reference to FIGS. 1-4, several embodiments of air plasma systems 10 with heated source gas are shown. The methods and equipment for heating shown are merely examples, however, and any suitable method or equipment for raising the temperature of the source gas above the ambient temperature may be used. With reference to FIG. 1, an inline heater or heating element 18 is provided within, or as part of, the air supply 16. An inline heater may be any device that forms a portion of the air supply conduit 16, such as by carrying, transporting, and/or directly contacting or heating the source air. Inline heaters are used in applications such as baking, heat shrinking, sterilization, drying, and others and will not be described in detail. In general, inline heaters include a tube or conduit 20 having an air inlet 22 and an air outlet 24 with a heating element disposed in between. Any suitable heating method may be used as the heating element, such as a resistance coil or induction heating. The temperature of the air may be controlled in any suitable way, such as by adjusting the wattage of the heating element, adjusting the amount or current passing through the heating element (e.g., resistance coil), or adjusting the resistance of the heating element (for example, using a potentiometer). If an inline heater 18 is incorporated into the system 10, the air supply 16 may be split into an ambient temperature portion 26 and a heated air portion 28, which may connect to the air inlet 22 and air outlet 24, respectively. A temperature sensor, such as a thermocouple, may be located in, near, or adjacent to the air outlet 24 or the beginning of the heated air portion 28 in order to facilitate control of the air temperature as the air exits the heater 18 and travels to the probe 12.

Figure 2:
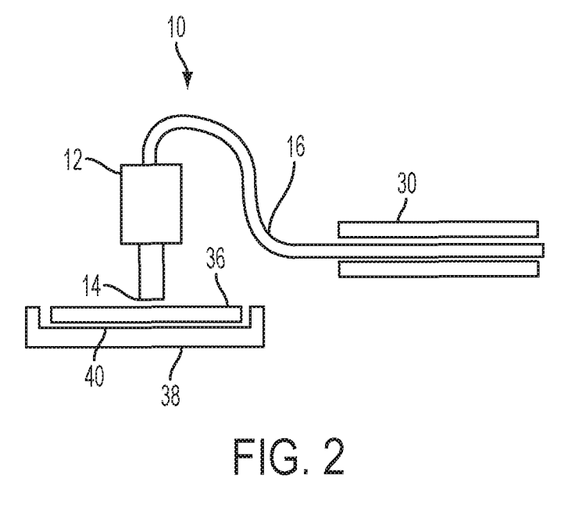
FIG. 2 is a schematic view of an atmospheric plasma system including an external heat source, according to an embodiment.
Figure 3:
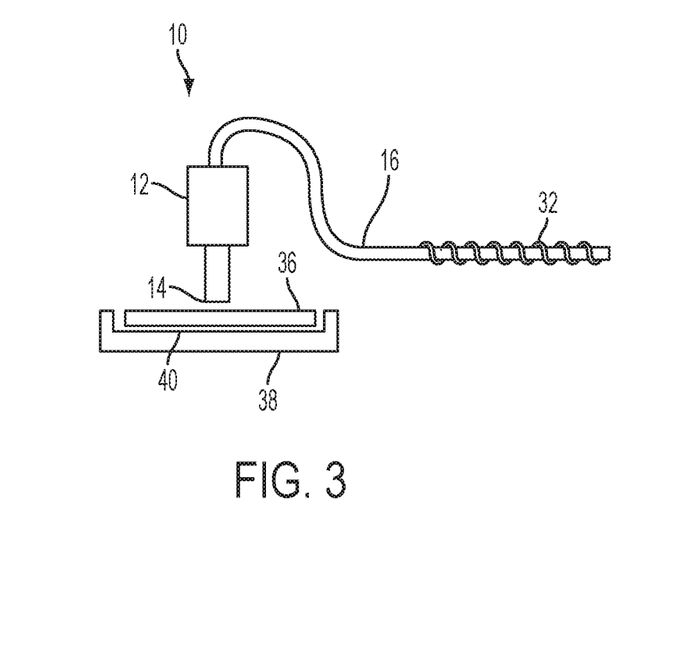
FIG. 3 is a schematic view of an atmospheric plasma system including an induction heating system, according to an embodiment.

With reference to FIGS. 2 and 3, an air plasma system 10 is shown in which the air supply conduit 16 is heated externally by a heat source 30. Compared to an inline heater, the heat source 30 may indirectly heat the air in the air supply 16 by heating the air supply conduit 16 itself. In one embodiment, an example of which is shown in FIG. 2, the heat source 30 may include a wrap or sleeve that extends around and heats the air supply 16. The heat source 30 may include a heating belt that wraps around the air supply 16 and includes a resistance heating element, such as a wire or coil. The heat source 30 may also include a liquid or gas heating system, wherein a heated liquid or gas is passed through a tube or conduit in the wrap/sleeve/jacket, thereby transferring heat to the air supply 16. For example, a counter-flow heating system may be used in which a heated fluid, oil, or water may be used as a heat transfer media. The heat transfer media may be heated by a heater (either locally or remotely) and may be circulated in a direction opposite the flow direction of the source air using a pump (not shown). Accordingly, the source air may be heated by a transfer of heat energy from the transfer media. As shown in FIG. 3, the heat source 30 may also include an induction coil 32 that wraps around the air supply 16. For an induction coil heating element to be effective, the air supply may be made of an electrically conductive material, such as a metal. In addition to a sleeve or wrap around the air supply 16, other methods of heating the air supply may also be used. For example, infrared heaters may be positioned and configured to heat the air supply 16 or flame-based heaters may be used, such as direct flame or indirectly by combustion-based heaters.

Figure 4:
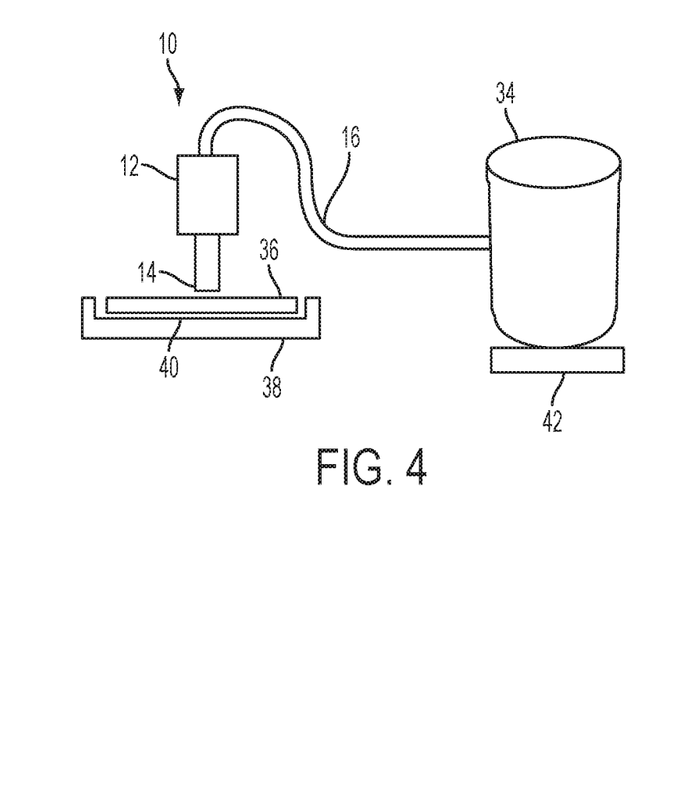
FIG. 4 is a schematic view of an atmospheric plasma system including a heated air tank, according to an embodiment.

With reference to FIG. 4, an example of a plasma system 10 is shown in which the source air is heated prior to traveling through the air supply conduit 16. In one embodiment, the source air is supplied from a heated air tank 34. In one embodiment, the air supply conduit 16 and the heated air tank 34 may form an air supply system. The heated air tank 34 may also be pressurized, such that it provides heated and compressed air to the air supply 16 and the plasma probe 12. The tank 34 may be heated using any suitable method. For example, the methods of heating the air supply 16 shown in FIGS. 1-3 and described above may all be applied to the tank 34, such as resistance heaters/coils (e.g., similar to electric water heaters), induction heating, liquid/gas heating, or others. These heat sources may be inside the tank 34 or external to the tank 34. The tank may also be heated by resting it on a burner 42, similar to a gas water heater. In one embodiment, the tank may contain a liquid that may be heated to its evaporation temperature, thereby forming a heated gas that may be used as the source air. For example, water may be boiled (e.g., at 100° C. at 1 atm) and the steam may form all or a portion of the source gas. Accordingly, rather than heating the source air as it travels through the air supply 16, the source air may all be heated in a tank and transferred to the plasma probe 12 in an already heated state. In any of the embodiments described above, the heated air or gas may comprise the entire air source or it may be combined with other sources of air or gas to form the entire air source. For example, air may be heated using an inline heater and the heated air may be combined with unheated air to form an air source with an intermediate temperature. Similarly, heated air from a heated tank may be combined with unheated air to form the air source. Accordingly, while air supply 16 is shown as a single hose or conduit, it may split into separate hoses and/or separate hose may combine to form the air supply 16.

The air supply conduit 16 may be formed of any material suitable for the temperatures and/or pressures of the source gas. The air supply 16 may be formed as a hard or rigid pipe or it may be formed as a flexible hose. In embodiments where the source air is heated to a relatively high temperature, such 100° C. or greater, a hard or rigid pipe formed of a high-temperature material may be used for the air supply 16, or at least the heated air portion 28. For example, the air supply 16, or at least the heated air portion 28, may be formed of a metal pipe or conduit. In one embodiment, the air supply 16 or the heated air portion 28 may be formed of steel, such as stainless steel. In embodiments where the source air is heated to a relatively low temperature, such as less than 100° C., a flexible hose may be used, such as those formed from polymers. Non-limiting examples of plastics suitable for flexible pneumatic hoses may include nylon, PVC, nitrile, polyurethane, polyethylene, polypropylene, or others. While rigid (e.g., metal) pipe is described as suitable for high-temperature source air, it may also be used for lower temperature source air. Similarly, flexible hoses may be used for high-temperature source air, provided they are capable of withstanding the temperature used. In order to maintain the source air at the target or desired temperature, the air supply 16 may be insulated along all or at least a portion of its length (e.g., a portion or all of the heated air portion 28). The insulation may be provided using any suitable method, such as an insulating wrap, an outer tube or conduit containing an insulating material, foam insulation (pre-formed or expanding), or others.

In at least one embodiment, the source air is heated above the ambient air temperature. For example, if the ambient temperature is a standard room temperature of about 20° C., then the source air may be heated to above 20° C. and may be arrive at the probe 12 at a temperature above the ambient temperature. As described above, it is believed that when air is heated, the electrons orbiting around nuclei gain energy from the heat and have a higher probability of escaping from their confined travel orbits and there is a higher chance of air ionization occurring in the electric field, which may generate a stronger plasma flume. Accordingly, it is believed that, in general, higher air temperatures will result in a stronger plasma flume. Therefore, in theory, the temperature of the source air may be maximized to provide the strongest possible plasma flume. However, considerations such as cost, equipment, and the material being plasma treated may result in practical limitations on the source air temperature.

The source air may be heated to a temperature of at least 25, 30, 50, 75, 100, 150, 250, 500, or 1,000° C. Stated in ranges, the source air may be heated to a temperature of 25 to 1,000° C., or any sub-range therein. For example, the source air may be heated to a temperature of 25 to 750° C., 25 to 500° C., 30 to 250° C., 50 to 250° C., 75 to 250° C., 100 to 250° C., 100 to 500° C., or other ranges within 25 to 1,000° C. As described above, higher temperatures may generally result in a stronger plasma flume, which may increase the probe speed and/or the probe distance. However, higher temperatures require more energy and may require more expensive equipment. In addition, a relatively low temperature increase in the source air may be sufficient to improve the plasma flume strength for some embodiments. Therefore, the temperature increase of the source air may be adjusted based on the desired properties or requirements of the application. Higher temperatures may result in lower cycle times and a more robust process, while lower temperatures may be more cost and/or energy efficient. The temperature ranges and values described above may be the temperature of the source air as it leaves the heating source (e.g., inline heater, induction heated air supply, or heated air tank/source) or it may be the temperature of the source air when it reaches the plasma probe. If the air supply 16 is insulated, these two temperatures may be substantially the same. However, if the air supply is not insulated or if the air supply 16 has a long length, the temperature of the air when it reaches the probe may significantly less than its maximum temperature at the heat source. To maintain the source air temperature, multiple heating sources may be used along the length of the air supply 16. Any combination of the heating sources described above may be included, including multiples one or more heating sources. For example, the source air may be supplied from a heated tank and also heated using an inline heater located near the probe to either maintain or boost the temperature. Another example may include an inline heater followed by a heated wrap or belt to maintain or boost the temperature.

As described above, the strength of the plasma flume may affect multiple plasma treatment parameters, including the probe speed and the working window (e.g., probe tip distance). As a result of the disclosed heated source air, the probe speed may be increased and/or the probe tip distance may be increased. The probe speed may be measured as the relative speed between the probe tip and the surface of a component 36 to be treated and/or a fixture 38 that holds the component 36. Conventional air plasma treatments may have a probe speed of about 50 mm/s and a probe tip distance of about 6 mm in order to provide a sufficient plasma dosage to the treated surface. In at least one embodiment, a plasma system having heated source air may have a probe speed (e.g., relative to the treated surface or a fixture) of at least 75, 100, 150, 250, 400, 600, or 1,000 mm/s. For example, the probe speed may have a speed of 75 to 1,000 mm/s, or any sub-range therein, such as 100 to 1,000 mm/s, 150 to 750 mm/s, 250 to 750 mm/s, 400 to 750 mm/s, 500 to 700 mm/s, or other ranges. In addition to, or instead of, increasing the probe speed, the distance from the probe tip to the treated surface (or working window) may be increased. In at least one embodiment, the probe tip distance may be at least 8, 10, 12, 15, 20, or 25 mm. For example, the probe tip distance may be from 8 to 25 mm, or any sub-range therein, such as 8 to 20 mm, 10 to 20 mm, 12 to 20 mm, 12 to 18 mm, 14 to 18 mm, or other ranges. The above values and ranges for the probe tip distance may also be applied as the distance from the probe tip to a surface 40 of the fixture 38 that receives and holds the component 36 to be treated. In embodiments where the probe tip distance is calculated from the probe tip to the fixture, the values and ranges above for the probe tip distance may adjusted (e.g., increased) to account for the thickness of the component being treated. For example, if the component to be treated has a thickness of 5 mm, then the probe tip distance may be at least 13, 15, 17, 20, 25, or 30 mm (instead of 8, 10, 12, 15, 20, or 25 mm).

While the disclosed heated source air may allow for the increase in probe speed and/or distance, as described above, it should be understood that the conventional speeds and distances may also be used with the heated source air and may provide a stronger plasma flume under the conventional parameters. However, increasing the plasma probe speed and distance, while maintain sufficient plasma dosage, may have several benefits. Increasing the probe speed may allow for a reduction in cycle time, or the time needed to treat a part or a group of parts. Reduced cycle times may allow for a higher volume of parts to be treated and may allow for the plasma treatment to be incorporated more seamlessly into a high-volume production line. In addition, reduced cycle time may reduce the number or size of plasma treatment systems needed in a production line, thereby reducing costs and lowering the footprint (e.g. square footage) of the plasma treatment process.

Increasing the probe tip distance or the working window size may also improve the plasma treatment process, for example by making the plasma treatment more robust. As described above, components 36 to be plasma treated may be loaded onto a fixture 38 (by hand or by robot). This fixturing process will inherently have some level of deviation, for example, about 2 mm. If the working window is small, then the deviation may take the component out of the working window and the plasma treatment may become ineffective or harmful to the component. Conventional plasma treatments may have a working window of about 6 mm±1-2 mm. Therefore, the expected deviation of about 2 mm may be problematic, since it can place the component outside of the working window. However, by increasing the effective probe tip distance using the disclosed heated source air, the working window may be expanded such that deviations of several mm will not result in ineffective plasma treatment. A plasma treatment that can still provide a sufficient dosage from, for example, 16 mm from the probe tip may therefore better absorb or compensate for a deviation of several mm (e.g. 1-3 mm).

The disclosed air plasma system 10 including heated source air and various methods of heating the source air may be used in any application where conventional or typical air plasma treatments are used. For example, the disclosed system may be used to activate (e.g., increase the surface energy) and/or clean plastic and/or metal surfaces prior to adhesive bonding or painting processes. The air plasma system may be used to treat any type of surface, such as metals, plastics, composites (e.g., fiber composites), or ceramics. In at least one embodiment, one or both of two mating surfaces may be treated in order to improve adhesion, for example, using an adhesive or binder. In another embodiment, a single surface may be treated, for example, prior to applying a coating or layer of paint.

Figure 5:
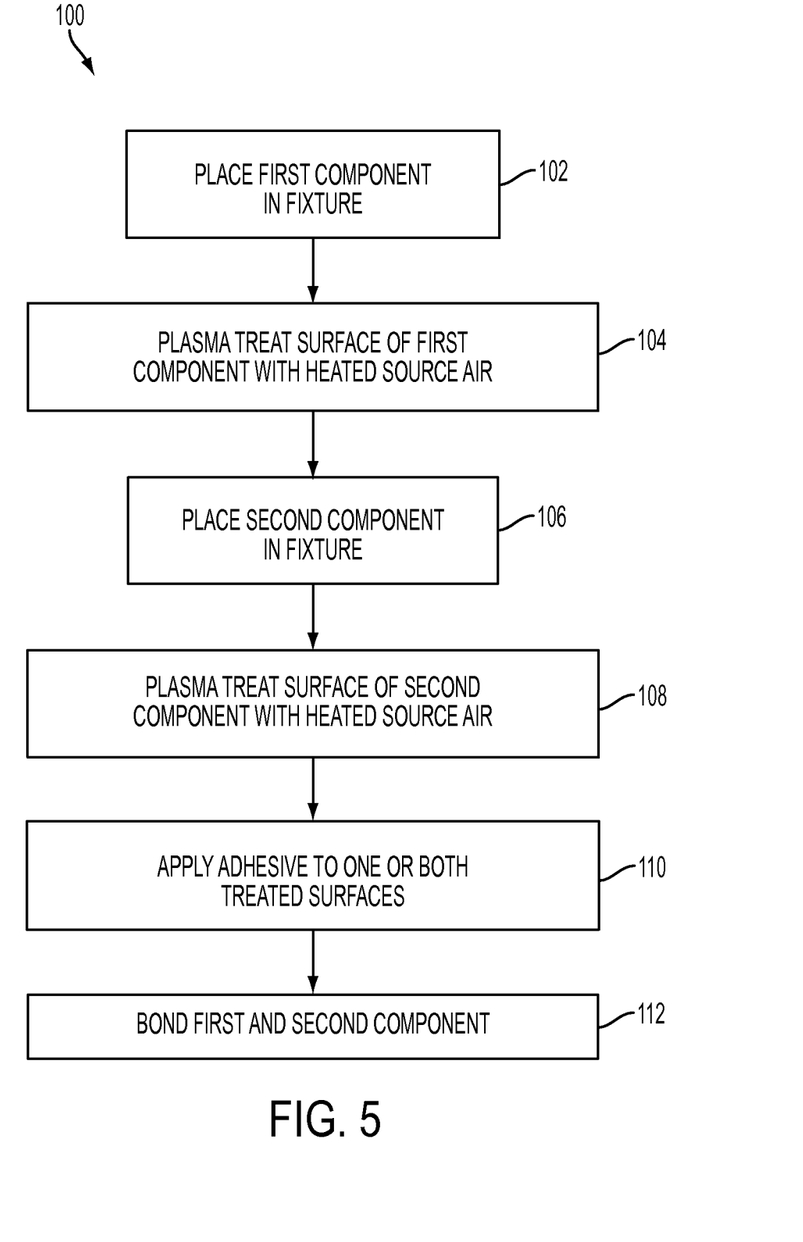
FIG. 5 is a flowchart of a method for a heated air plasma treatment, according to an embodiment.

With reference to FIG. 5, an example of a flowchart 100 for plasma treating a pair of mating automotive components with heated source air is shown. In step 102, the first component 36 may be placed in a fixture 38 in order to be plasma treated. The component 36 may be loaded into the fixture 38 (fixtured) manually or by a robot (e.g., using vacuum). In step 104, a surface 42 of the first component 36 may be plasma treated using a system that provides heated source air to the plasma probe. As described above, the heated source air may allow the plasma probe to have an increased speed and/or probe tip distance or working window. In steps 106 and 108, a second component 36 may be fixtured and a surface plasma treated, similar to steps 102 and 104. In step 110, an adhesive may be applied to one or both of the plasma-treated surfaces. In step 112, the two components may be pressed together in order to bond the components. Depending on the type of adhesive, heat and/or pressure may be applied to assist in the curing of the adhesive.

The method described in flowchart 100 may be applied to an automotive manufacturing process. Numerous components are bonded or painted during the manufacture and assembly of an automobile. The components to be treated may be metals, such as steel (e.g., stainless steel), titanium, aluminum, alloys thereof, or others. In one embodiment, the metal may be in the form of a sheet. The components may also be polymers, such as polyesters, vinyls, epoxies, polyethylene, polypropylene, polyurethane, or others. In addition, the components may include composites, such a fiber-reinforced composites, for example, glass fiber composites, carbon fiber composites, sheet molding compound (SMC), bulk molding compound (BMC), or others. The components may be any automotive components that are bonded, coated, or painted. For example, body panels, deck lids, bumpers, fenders, or others. Some parts may be formed from two components, one with a higher quality, "Class A" surface and one that is more structural in nature. For example, a decklid may be formed from an inner and outer component, wherein the inner decklid component is a structural component and the outer decklid component is a Class A surface component.

Accordingly, in one example, inner and outer decklid components may be formed from SMC and a surface of each component may be plasma treated using a plasma system with heated source air. After the components are treated, they may be bonded together using an adhesive, such as an epoxy, silicone, urethane, or acrylic-based adhesive. In another example, the outer decklid, or another exterior component such as a hood or bumper, may have an outer surface plasma treated using a plasma system with heated source air and then the surface may be painted.

Figure 6:
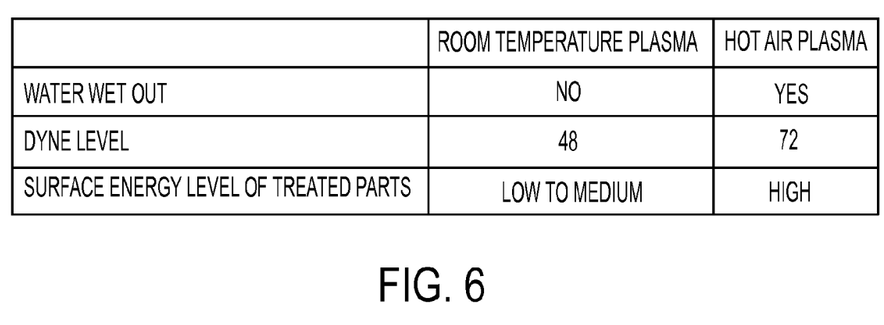
FIG. 6 is a table including data from surface energy testing of room temperature plasma and heated air plasma treatments.

With Reference to FIG. 6, the results of a water wet-out test are shown. A water wet-out test may measure the surface energy of a surface by testing whether water will completely wet the surface (e.g., a contact angle of 0°). Two samples of polypropylene were prepared, one received a room temperature air plasma treatment and the other received a plasma treatment having heated source air. The plasma treatments were both performed with a probe speed of 600 mm/s and a probe tip distance of 16 mm. As described above, this speed and distance is significantly greater than what is conventionally used (e.g., about 50 mm/s and 6 mm). The source air for the heated air plasma was heated to a temperature of about 100° C. and was compressed to a pressure of about 30 psi. The voltage supply for the air plasma system was 240 V.

As shown in the table in FIG. 6, the polypropylene sample treated with room temperature plasma did not allow water to completely wet the surface. In comparison, the sample treated with heated air plasma did allow water to completely wet the surface, indicating a significant increase in surface energy as a result of an increased received plasma dosage. Dyne level testing was performed on both samples using a dyne test kit, the results of which are shown in FIG. 6. As shown, the room temperature plasma treatment resulted in a surface energy of 48 dynes/cm and the heated air plasma resulted in a surface energy of 72 dynes/cm. The third row of the table in FIG. 6 shows a qualitative indication of the surface level of each plasma treated sample. The surface energy of the room temperature plasma at the high probe speed and large probe distance is relatively low, while the surface energy of the heated air plasma is still high. The results in FIG. 6 therefore indicate that the plasma flume for the heated air plasma was stronger than the room temperature plasma and a higher dosage of plasma was received. Accordingly, the heated air plasma treatment allows for a substantially increased speed and probe tip distance, while still providing a sufficient plasma dosage to the treated components. These increases may allow for a lower cycle time and a more robust treatment process.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An atmospheric air plasma system, comprising:
   a plasma probe configured to receive a source of air that is at or above atmospheric pressure and discharge an air plasma from a probe tip to treat a component;
   an air supply system including an air supply conduit configured to supply the air to the plasma probe; and
   a heat source configured to increase a temperature of the air in the air supply system to above an ambient temperatures;
   wherein the plasma probe is configured to discharge the air plasma from the probe tip at a relative speed between the probe tip and the component of 100 mm/s to 1,000 mm/s.

2. The system of claim 1, wherein the heat source includes an inline heater.

3. The system of claim 2, wherein the inline heater forms at least a portion of the air supply conduit.

4. The system of claim 1, wherein the heat source at least partially surrounds a portion of the air supply conduit.

5. The system of claim 1, wherein the heat source is configured to boil a liquid to produce at least a portion of the source of air.

6. The system of claim 1, wherein the air supply system includes an air tank connected to the air supply conduit and the heat source is configured to heat the air tank to increase a temperature of air in the air tank.

7. The system of claim 1, wherein the heat source is configured to heat the air to a temperature of 25° C. to 1,000° C.

8. A method of plasma treating a surface, comprising:
   heating a source of air within an air supply system including an air supply conduit to a temperature above an ambient temperature;
   providing the heated air to a plasma probe via the air supply conduit;
   generating an atmospheric air plasma in the plasma probe; and
   discharging the plasma from a plasma probe tip onto the surface at a relative speed there between of at least 250 mm/s.

9. The method of claim 8, wherein the heating step includes heating the air with an inline heater disposed within the air supply conduit.

10. The method of claim 8, wherein the heating step includes heating the air with a heat source that at least partially surrounds a portion of the air supply conduit.

11. The method of claim 8, wherein the air supply system includes an air tank and the heating step includes heating the air tank to increase a temperature of air in the tank.

12. The method of claim 8, wherein the discharging step includes moving the plasma probe tip at a speed of at least 600 mm/s relative to the surface.

13. The method of claim 8, wherein the discharging step includes maintaining a distance from the tip of the plasma probe to the surface of at least 15 mm.

14. The method of claim 8, wherein the heating step includes heating the source air to a temperature of 25° C. to 1,000° C.

15. The method of claim 8, wherein the heating step includes boiling a liquid to produce at least a portion of the source of air.

16. An atmospheric air plasma treatment system, comprising:
   a plasma probe configured to receive a source of air that is at or above atmospheric pressure and discharge an atmospheric air plasma from a probe tip;
   an air supply conduit configured to supply the air to the plasma probe;
   a heat source configured to increase a temperature of the air in the air supply conduit; and
   a fixture configured to receive a component to be plasma treated;
   wherein the plasma probe is configured to discharge the atmospheric air plasma from the probe tip at a distance of at least 15 mm from a surface of the component and at a relative speed between the probe tip and the component of at least 250 mm/s.

17. The system of claim 16, wherein the heat source includes an inline heater.

18. The system of claim 16, wherein the heat source is configured to heat the air to a temperature of 25° C. to 1,000° C.

19. The system of claim 16, wherein the plasma probe is configured to move the plasma probe tip at a speed of at least 600 mm/s relative to the component.

20. The system of claim 16, wherein the heat source is configured to boil a liquid to produce at least a portion of the source of air.

* * * * *